United States Patent

[11] 3,611,170

[72] Inventor Carl Franklin Wheatley, Jr.
Somerset, N.J.

[21] Appl. No. 869,708

[22] Filed Oct. 27, 1969

[45] Patented Oct. 5, 1971

[73] Assignee RCA Corporation

[54] BIAS NETWORKS FOR CLASS B OPERATION OF AN AMPLIFIER

12 Claims, 8 Drawing Figs.

[52] U.S. Cl. .......................................................... 330/13, 307/297, 307/303, 330/15, 330/17, 330/22, 330/30, 330/38 M, 330/40

[51] Int. Cl. .......................................................... H03f 3/18

[50] Field of Search .......................................... 330/13, 17, 15, 38 R, 38 M, 22, 40; 307/297, 303

[56] References Cited

OTHER REFERENCES

Electronics, Mar. 4, 1968, Vol. 41 No. 5, P. 58 330-38MI

Electronic Design, Mar. 1, 1968, Vol. 5 P. 42 330-13

*Primary Examiner*—Roy Lake

*Assistant Examiner*—James B. Mullins

*Attorney*—Eugene M. Whitacre

ABSTRACT: A means for baising a complementary Class B transistor amplifier which has the capability of maintaining the amplifier at a minimum distortion operating point over large ambient temperature variations.

INVENTOR.
CARL F. WHEATLEY, JR.
BY Martin Sachs
Attorney

INVENTOR.
CARL F. WHEATLEY, JR.
BY Martin Sachs
Attorney

BIAS NETWORKS FOR CLASS B OPERATION OF AN AMPLIFIER

The invention herein described was made in the course of or under a contract with the Department of the Army of the United States.

This invention relates to bias networks and, more particularly, to biasing arrangements for Class B amplifiers which may be fabricated with integrated-circuit techniques.

As used herein, the term integrated circuit refers to a unitary or monolithic semiconductor structure or chip incorporating the equivalent of a network of interconnected active and passive electrical circuit elements such as transistors, diodes, resistors, capacitors and the like.

In a push-pull Class B amplifier, whether complementary (opposite conductivity) or like semiconductors are utilized, one output transistor ideally conducts current only when the input signal is positive and the other conducts only when the input signal is negative. Class B amplifiers operate with a significantly greater power efficiency than Class A amplifiers and have negligible power consumption when no input signal is applied. It is therefore advantageous to operate integrated-circuit power amplifiers in the Class B mode since the power dissipation capabilities of these small chips are limited.

Unfortunately, crossover distortion is a characteristic associated with Class B amplifiers and is encountered particularly when transistors are utilized for the output stages. This distortion is introduced by the lack of a smooth transition from conduction in one output transistor to conduction in the other. A number of design techniques and bias methods have been devised to reduce the crossover distortion introduced by this type of amplifier. When utilizing integrated-circuit techniques, this objective preferably is accomplished without the aid of resistors and/or capacitors.

One method of reducing the crossover distortion comprises coupling the Class B output stage in a closed loop with enough negative feedback to reduce the distortion to an acceptable level. However, since this distortion is composed of frequencies much higher than that of the signal being amplified, this feedback method requires that the frequency response around the feedback loop be flat far above the highest frequency at which the amplifier is intended to operate.

Another method of reducing crossover distortion is to apply a fixed bias voltage to the base of each of the pair of output transistors to cause each of them to conduct slightly, even when there is no input signal. This method effectively prevents crossover distortion but creates another problem. The no signal standby current is dependent upon the operating temperature and increases with increasing temperature. There is, therefore, danger of thermal runaway and chip burnout.

A solution to the crossover distortion problem is set forth in accordance with the present invention whereby a temperature-sensitive semiconductor bias network is provided to bias a pair of complementary output transistors to a prescribed relatively low amplitude of standby or idling current. In a preferred embodiment, the bias network is constructed on the same integrated-circuit chip as the complementary amplifier, and therefore is capable of maintaining the output idling current essentially constant over a wide range of ambient operating temperatures.

It is an object of this invention to provide a biasing circuit which is suitable for establishing and maintaining a stable relatively low-amplitude standby current for Class B complementary integrated circuit amplifiers over a wide temperature range.

Another object of this invention is to provide a bias circuit which has a low impedance as compared to the input impedance of the associated amplifier devices for signal frequency components.

In accordance with one embodiment of the invention, the bias circuit is used in conjunction with semiconductor amplifying devices of opposite conductivity types which have input, output, and common electrodes. The output electrodes of the amplifying devices are connected to a load while the input electrodes are utilized for coupling input signals and have the bias circuit connected therebetween. The bias supply provides a variable relatively low-impedance current path between the input electrodes. A second variable relatively higher impedance current path coupled to the low-impedance path is also provided between the input electrodes. In addition a third variable still higher impedance current path is provided between the input electrodes and is coupled to the relatively higher impedance. A substantially constant current source is connected to the bias supply to maintain a relatively high source impedance for the bias current. In this manner the bias supply provides a bias voltage between the input electrodes of the semiconductor amplifying devices which is maintained at the proper operating point for large ambient temperature variations.

For a better understanding of the present invention, together with further objects thereof, reference is made to the following description taken in conjunction with the accompanying drawing wherein.

Figure 1:
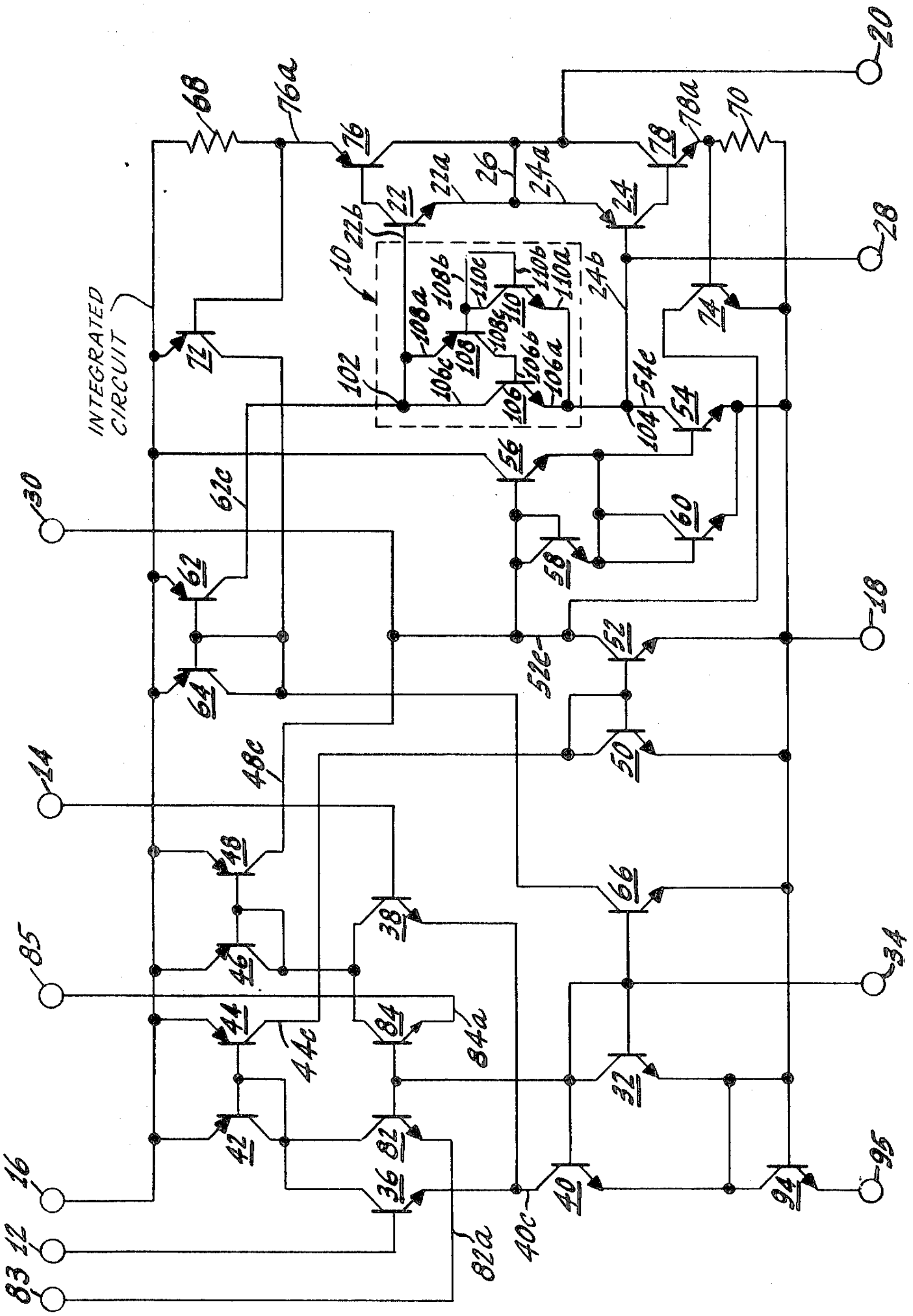
FIG. 1 is a schematic diagram of an operational amplifier fabricated on a monolithic semiconductor chip utilizing a Class B complementary symmetry output stage employing a bias network constructed in accordance with the present invention.

Referring to FIG. 1 of the drawing, an operational amplifier fabricated on a monolithic integrated circuit chip is illustrated. The operational amplifier utilizes a bias arrangement for a Class B output stage which is constructed in accordance with the present invention and is shown within dotted lines 10. In the operational amplifier, input signals may be applied between ground and a noninverting input terminal 12, between ground and an inverting input terminal 14 or between input terminals 12 and 14. An operating supply voltage positive with respect to ground is applied at a terminal 16 while a negative operating supply voltage is applied at a second terminal 18. An external load is connected from a terminal 20 to ground.

Bias currents for the operational amplifier elements are established either directly or indirectly by a bias supply transistor 32, which is adapted for connection to an external source of bias current by means of a chip terminal 34. A differential pair of input transistors 36 and 38, to which terminals 12 and 14 are connected, are coupled to the collector 40*c* of a current source transistor 40, which is biased by transistor 32. Outputs are coupled from transistor 36 and 38 by means of voltage-level-shifting diode transistor combinations 42, 44 and 46, 48, respectively. The collector 44*c* of transistor 44 is connected to a further diode transistor level shift combination 50, 52. The collectors 52*c* and 48*c* of transistors 52 and 48 are connected together so as to combine the collector currents of transistors 48 and 52, thereby providing a single-ended current generator having a current amplitude essentially equal to the difference between the collector currents of transistors 36 and 38.

The level-shifted differential current of transistors 36 and 38 is then amplified by the current amplifier combination of transistors 54 and 56. Each of transistors 54 and 56 has its current gain degenerated by a respective small-geometry diode-connected transistor 58 and 60. The current gain of the transistor circuit comprising transistors 54, 56, 58, and 60, is fairly independent of processing and is designed to be approximately 100.

The collector **54*c* of the current amplifier circuitry is biased by a constant current source provided by a transistor 62. Transistor 62 is biased by a diode-connected transistor 64 which is biased by a transistor 66. Transistor 66, in turn, is biased by transistor 32. The collectors 54*c* and 62*c* are coupled together by means of the output bias network 10. Bias network 10 is coupled between two input terminals 102 and 104 of a Class B complementary symmetry output amplifier comprising PNP transistors 24 and 76 and NPN transistors 22 and 78. The output amplifier transistors 76 and 22 are arranged in a complementary current amplifier configuration and form a composite NPN transistor which is connected to a second complementary current amplifier configuration consisting of transistors 78 and 24** which form a composite PNP transistor. The two composite complementary transistors are connected in series between positive and negative sources of voltage.

The two-terminal bias network 10 is coupled between terminals 102 and 104 within the circuit chip. In the bias circuit 10 the collector **106*c* of an NPN transistor 106 is connected to the first bias network terminal 102 while its emitter 106*a* is connected to the second bias network terminal 104. The base 106*b* of transistor 106 is connected to the collector 108*c* of a PNP transistor 108. The emitter 108*a* of transistor 108 is connected to the collector 106*c*. The base 108*c* of transistor 108 is connected to the collector 110*c* and base 110*b* of a further NPN transistor 110. The emitter 110*a* of transistor 110 is connected to emitter 106*a***.

The output of the amplifier is developed across an external load connected from terminal 20 to ground which may be between 1 and 50K ohms. The emitters **22*a* and 24*a* of transistors 22 and 24 may be connected to output terminal 20 as shown or connection 26 may be broken and both emitters 22*a* and 24*a* may be connected to a ground reference. Phase compensation is obtained by externally connecting a 10- to 100-picofarad capacitor between terminal 30 and terminal 28 or 20**. The value of the capacitor depends upon the closed loop gain and the bias level employed.

Resistors 68 and 70 are utilized in conjunction with transistors 72 and 74 respectively to provide short circuit and overdrive protection. Transistors 22 and 24 as well as the transistors 76 and 78 are protected against destructive overdrive.

Transistor 94, connected as a zener diode, is included on the circuit chip to provide regulation of the bias current in the event that the DC supply potential is sufficiently greater than 4 volts. Plus and minus 3 volt sources of potential are suitable for proper operation of the operational amplifier. In the event that a higher negative voltage is all that is available, terminal 95 would be grounded and a suitable resistor would be connected from terminal 18 to the higher negative voltage. Provisions are also made for externally balancing the amplifier without need to disturb the input circuitry. These balancing means are provided by transistors 82 and 84. If one transistor emitter, for example **82*a*, terminal 83, is placed at B- and the other emitter 84*a*, terminal 85, is open, the balance is displaced approximately 5 millivolts. The inverse connection will yield a balance displacement of approximately −5 millivolts. Hence, a simple potentiometer connected to each balance terminal 83 and 85, with the center arm at B− potential will provide a stable balance operation approaching ±5 millivolts input. If balance is not necessary, both terminals 83 and 85** may be left open, or may be tied to B−. The circuit performance will not be significantly altered in either case.

It is also to be understood that the present invention is not limited to use by integrated-circuit techniques but is also applicable to circuits designed with discrete components and that NPN devices may be replaced by PNP devices as long as consistency is maintained and the supply potentials are correspondingly reversed.

The manner in which the bias network 10 operates in conjunction with the output amplifier transistors 22, 24, 76 and 78 will now be described in conjunction with FIGS. 2 and 3 of the drawing.

Figure 2:
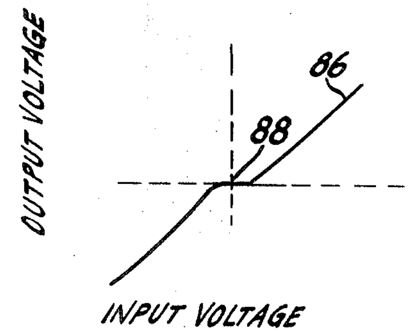
FIG. 2 is a graphic representation of a typical output voltage vs. input voltage transfer characteristic of a Class B amplifier exhibiting crossover distortion.

Referring to FIG. 2 of the drawing, the illustrated curve 86 is a plot of the output voltage vs. the input voltage of a complementary transistor amplifier operating class B with the input bases of both devices directly connected to each other. The crossover area 88 is the region wherein one transistor is leaving its conducting state and the second transistor is about to enter its conducting state. The gain of each transistor is reduced substantially in the low current threshold area and, until the signal can overcome the transistor conduction threshold, no output voltage is produced. The transistor threshold or dead region is about 0.4 volt for the type of transistors typically utilized in the monolithic semiconductor chip of the type shown in FIG. 1. Referring to FIG. 1, assume that the base **22*b* of transistor 22 is shorted to the base 24*b* of transistor 24 (a short between points 102 and 104) and transistor 54 has its collector 54*c* connected to the shorted bases 22*b* and 24*b*. Assume also that the output terminal 20 is at a ground reference point. It then follows that the collector 54*c* must be set at a bias of zero volts to be centered between the conduction points of transistors 22 and 24. A signal therefore would be required to swing to +0.4 volt to start transistor 22 conducting and would be required to swing to −0.4 volt to start transistor 24** conducting. This represents a dead crossover region of ±0.4 volt or a total of 0.8 volt.

Figure 3A:
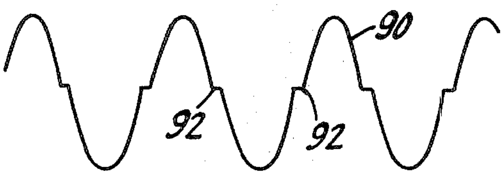
FIG. 3A is the output voltage wave shape, for a sine wave input, with zero bias between the input electrodes of a complementary Class B amplifier.

FIG. 3A illustrates an output voltage waveform 90 including the distortion 92 introduced by a class B transistor amplifier of the type described above (inputs shorted together) when a sine wave input is impressed on the common input bases. The dead area of zero output occurs as the sine wave input signal crosses the zero axis.

Consider an alternate condition whereby a transistor with its collector shorted to its base is inserted between points 102 and 104. The collector base terminal is connected to 102 and its emitter is connected to point 104 and it has a voltage drop of approximately 0.5 volt. The bias point for the collector **54*c* is now adjusted to −0.25 volt to be centered leaving a +0.25-volt positive bias on the base 22*b* of transistor 22. An input signal swing at the collector 54*c* of +0.15 volt would permit transistor 22 to start conducting. An input signal swing at collector 54*c* of −0.15 volt would be added to the DC bias of −0.25 volt at the base of transistor 24** thereby permitting it to start conduction at that point. The dead region crossover is reduced to ±0.15 volt or a total of 0.3 volt.

Figure 3B:
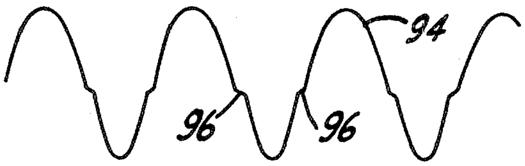
FIG. 3B is the output voltage wave shape for a sine wave input when a diode connected transistor is used to supply bias between the input electrodes of a complementary Class B amplifier.

Referring to FIG. 3B of the drawing, the illustrated curve 94 shows the output voltage obtained for a sine wave input to a class B complementary amplifier employing such a bias arrangement. The distortion 96 has been reduced by the use of a transistor, with its collector shorted to its base, connected between the bases of the complementary output transistors but crossover distortion still results. Furthermore, using a bias source unmatched to the emitter-base temperature characteristics of the output transistors also causes distortion to be introduced whenever a temperature change occurs.

In accordance with the present invention, the bias source 10, which produces a bias voltage of approximately 0.8 volt, permits the output amplifier to follow the input signal with essentially zero dead space yielding no appreciable distortion. The bias source 10 also is arranged to vary in a compensating manner with respect to the output transistors as temperature changes.

In operation, the zero signal collector current of the output transistors 22, 76, 24, 78 is of the order of 3 nanoamperes to 4 microamperes and the bias current supplied to the bases of transistors 22 and 24 is of the same order of magnitude. Assuming the zero signal (quiescent) collector current is approximately 1 microampere, with a beta of approximately 100 for the NPN-type transistors and 10 for the PNP-type transistors, the base current $I_{b106}$ of transistor 106 is approximately 10 nanoamperes and the base current ($I_{b108}$) of transistor 108 is approximately 1 nanoampere, the latter current flowing in the collector-base to emitter path of transistor 110. These currents yield the following voltages. The emitter-base voltage drop of transistor 110 is approximately equal to 0.35 volt while the emitter-base drop of transistor 108 is approximately 0.43 volt. The total is essentially the 0.8 volt required for the proper bias point.

Figure 3C:
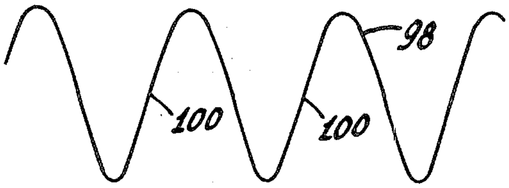
FIG. 3C is the output voltage wave shape for a sine wave input when the present invention is utilized to supply bias between the input electrodes of a complementary Class B amplifier.

In FIG. 3C the curve 98 shows that the crossover distortion 100 has been essentially eliminated at the crossover or dead region by the use of the bias circuit 10 shown in FIG. 1.

The PNP transistor 108 is temperature matched to transistors 24 and 76 since they are made simultaneously on the same chip while transistors 106 and 110 are temperature matched to transistors 22 and 78. In an integrated circuit structure, where the devices are constructed simultaneously and in close proximity to one another on a single chip, the conduction characteristics of all the devices will be substantially identical. Therefore, a change in the emitter-base voltage of the output transistors because of an ambient temperature change is carefully tracked and essentially cancelled out by a corresponding change in the bias circuit 10.

It should be noted that the bias circuit 10 is supplied from a relatively high-impedance, constant current source transistor 62. Undesirable loading of the input signal at low signal levels is therefore avoided.

Figure 4:
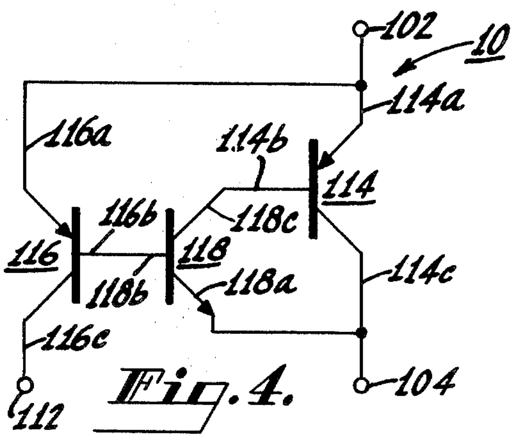
FIG. 4 is a schematic diagram of a first alternate embodiment of the bias circuit of the present invention.
Figure 5:
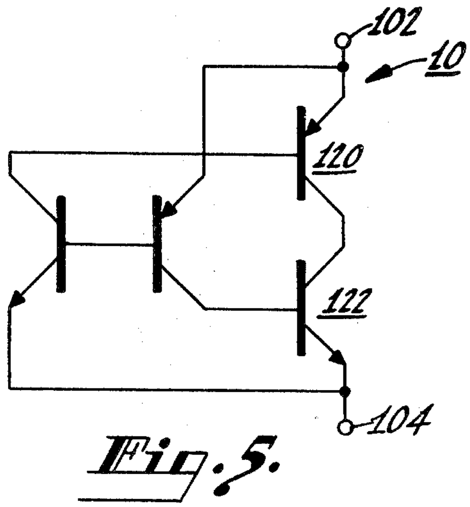
FIG. 5 is a schematic diagram of a second alternate embodiment of the bias circuit of the present invention.
Figure 6:
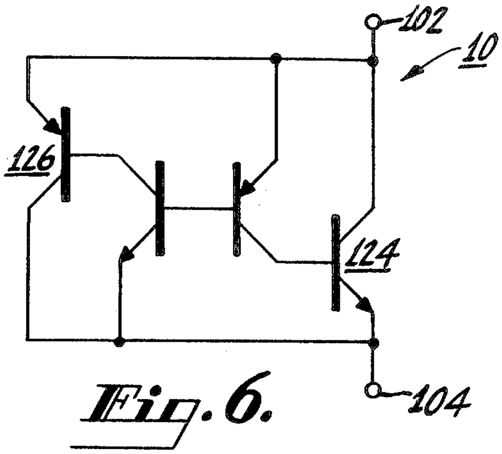
FIG. 6 is a schematic diagram of a third alternate embodiment of the present invention.

Alternate embodiments of the present invention are shown in FIGS. 4, 5 and 6 and are explained as follows.

A first alternate embodiment of the invention is shown at FIG. 4 of the drawing where the bias network is generally referred to as 10 and is connected between points 102 and 104 of FIG. 1. The third output point 112 is connected to the emitter 78*a* of transistor 78. In the first alternate embodiment a PNP transistor 114 is connected with its emitter 114*a* connected in common with the emitter 116*a* of a second PNP transistor 116 to point 102. The collector 114*c* of transistor 114 is connected in common with the emitter 118*a* of transistor 118 to point 104. The base 114*b* of transistor 114 is connected in common with the collector 118*c* of transistor 118 while the base 118*b* is connected to the base 116*b* of transistor 116. This embodiment of the invention performs in a manner similar to that described for the bias network 10 of FIG. 1 with the added improvement of having the collector 116*c* of transistor 116 connected to a more negative voltage than the base 118*b*. This permits transistor 116 to more closely track transistor 24 and 76 since they would now have similar $V_{ce}$ voltage across them. This would be equivalent to having the collector 110*c* connected to the emitter 76*a* of transistor 76 when the type of transistors shown in bias network 10 of FIG. 1 were utilized. The current flowing in the emitter-collector junction of transistor 116 more closely approximates the current flowing in the output amplifier transistor 24. This may be more readily explained if a current $I_o$ is assumed to flow in the emitter-collector junctions of output transistors 76 and 78 at no signal input.

Then: $I_{c22}=I_{b76}\cong I_o/B_P$ and $I_{c24}=I_{b78}\cong I_o/B_N$ where $B_P$ = =the current gain of a PNP transistor $B_N$ = the current gain of a NPN transistor $I_o$=quiescent current flow with no signal Then the required bias to yield $I_o$ is:

$$V_{Bias}=V_{be22}+V_{be24}$$

For good tracking a current approximately equal to $I_o$ should flow through the emitter-collector junction of transistor 114.

Then: $I_{c118}=I_{b114}=I_o/B_P$ and $I_{b116}=I_{b118}=I_o/B_PB_N$ so that $I_{c116}=B_PI_{b116}=I_oB_P/B_PB_N$ or $I_{c116}=I_o/B_N$ which is the same current flowing in transistor 24. Since PNP transistor 116 is of the same construction as PNP transistor 24 and is operating at approximately the same current and voltage complete tracking will be insured for large temperature variations. Similarly NPN transistor 118 and NPN transistor 22 are manufactured in the same manner at the same time and are operating at the same current. They, therefore, will track each other and also cancel out temperature effects.

It is to be noted that although in the present embodiments a bias network which consists essentially of the single $V_{be}$ of an NPN transistor and the single $V_{be}$ of a PNP transistor is utilized, further transistors may be connected in the manner shown to obtain higher bias voltages. The higher bias voltage obtained would be capable of tracking Class B amplifiers that require a higher bias voltage to bias to their proper operating point.

FIG. 5 is an alternate embodiment which operates as described previously and is constructed to have a complementary pair of transistors 120 and 122 connected in series between the bias points 102 and 104. Here again a two-terminal bias network 10 is obtained instead of the three-terminal network described in FIG. 4.

FIG. 6 is another alternate embodiment which operates in the same manner as described above except that there are two current paths for $I_o$ which would now flow in transistors 124 and 126. Here again it is only a two-terminal network and is suitable for tracking the $V_{be}$ voltage of a complementary Class B amplifier.

Incorporated on the present monolithic integrated circuit chip are PNP lateral transistors in the complementary configurations which permitted the design to be completed with conventional processing yielding high gain, a large voltage-swing capability, and low power consumption.

The present embodiment of the invention yields an amplifier capable of operating from direct current to 20 kilohertz with a voltage gain of 60 db., a power consumption of less than 1 milliwatt, and an output voltage swing of ±1.5 volts minimum into a 1- to 50-kilohm load with a distortion of approximately 6 percent.

What is claimed is:

1. A signal-amplifying circuit comprising:
first and second semiconductor amplifying devices of opposite conductivity types, each having input, output and common electrodes;
means for coupling said output electrodes to a load circuit;
input circuit means for coupling input signals to said input electrodes, said input circuit means comprising a bias supply coupled between said input electrodes, said bias supply comprising at least third, fourth and fifth semiconductor devices, said third and at least one of said fourth and fifth devices comprising a transistor having collector, emitter and base electrodes, the other of said fourth and fifth devices having at least one semiconductor junction, said bias supply further comprising means including at least the collector-emitter circuit of said third transistor for providing a variable, relatively low-impedance current path between said input electrodes, means for providing a second current path in parallel with said collector-emitter circuit between said input electrodes comprising the base-emitter circuit of said one device and said semiconductor junction of said other device coupled in series across said input electrodes and means for coupling said collector of said one device to said base of said third transistor for varying the impedance of said third transistor, said low-impedance and second current paths being selected to provide bias voltage between said input electrodes substantially equal to threshold conduction voltage of said amplifying devices; and
means for supplying a substantially constant current to said bias supply.

2. A signal-amplifying circuit according to claim 1 wherein:

said second current path is temperature responsive to provide a bias voltage which varies in accordance with operating temperature.

3. A signal-amplifying circuit according to claim 2 wherein: said fourth device corresponds to said one device and said fifth device corresponds to said other device, said fifth device comprising a transistor having base, emitter and collector electrodes and said semiconductor junction corresponds to the base-emitter junction of said fifth transistor.

4. A signal-amplifying circuit according to claim 3 wherein: said fifth transistor is of opposite conductivity type with respect to said fourth transistor.

5. A signal-amplifying circuit according to claim 4 wherein: said third and fifth transistors are of like-type conductivity.

6. An electrical circuit for providing bias comprising:

a. a first terminal;

b. a second terminal;

c. first, second and third semiconductor devices, said first device and at least one of said second and third devices having base, emitter and collector electrodes, the other of said second and third devices having at least first and second electrodes and a semiconductor junction between first and second electrodes;

d. constant current input circuit means connected to said first terminal for supplying constant current to said electrical circuit;

e. means for coupling said collector-emitter path of said first semiconductor device between first and second terminals;

f. means for coupling said base and emitter of said one device and said first and second electrodes of said other semiconductor device in series relation with each other and in parallel relation with said collector-emitter path of said first device between said first and second terminals; and g. means for coupling said base electrode of said first semiconductor device to said collector electrode of said one semiconductor device;

whereby said constant current input at said first terminal causes a bias voltage to appear across a relatively low impedance between said first and second terminals which biases and tracks a Class B amplifier for minimum output distortion.

7. An electrical circuit for providing bias according to claim 6 wherein:

a. all semiconductor devices are disposed in the same integrated circuit; and b. said first, second, and third semiconductor devices are transistors.

8. An electrical bias circuit according to claim 7 wherein said first and second electrodes are the emitter and base electrodes of said third transistor.

9. An electrical circuit for providing bias according to claim 8 wherein:

said second and third transistors are of opposite-type conductivity and said first transistor is of the same type conductivity as said third transistor whereby a bias voltage is maintained at the proper level to operate a Class B complementary amplifier with minimum distortion over a large ambient temperature range.

10. An electrical circuit for providing bias according to claim 9 wherein said first, second and third transistors exhibit characteristics responsive to temperature.

11. An electrical circuit for providing bias as set forth in claim 9 wherein said collector electrode of said third transistor is connected to said base electrode of said third transistor.

12. An electrical circuit for providing bias as set forth in claim 9 including a fourth semiconductor device having a collector-emitter path coupled in series with the collector-emitter path of said first transistor and a base electrode coupled to the collector electrode of said third transistor.